(12) United States Patent  
Seok et al.

(10) Patent No.: US 12,022,619 B2
(45) Date of Patent: Jun. 25, 2024

(54) SEMICONDUCTOR CHIP MODULE

(71) Applicant: SAMSUNG ELECTRONICS CO., LTD., Suwon-si (KR)

(72) Inventors: Jong-Hyun Seok, Seoul (KR); Gyu Chae Lee, Seoul (KR); Jeong Hyeon Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/309,413

(22) Filed: Apr. 28, 2023

(65) Prior Publication Data

US 2023/0269876 A1 Aug. 24, 2023

Related U.S. Application Data

(63) Continuation of application No. 17/210,907, filed on Mar. 24, 2021, now Pat. No. 11,678,437.

(30) Foreign Application Priority Data

Aug. 6, 2020 (KR) .................... 10-2020-0098372

(51) Int. Cl.
*H05K 1/18* (2006.01)
*H01L 25/18* (2023.01)
*H05K 1/11* (2006.01)

(52) U.S. Cl.
CPC ............. *H05K 1/181* (2013.01); *H01L 25/18* (2013.01); *H05K 1/117* (2013.01);
(Continued)

(58) Field of Classification Search
CPC .... H05K 1/18; H05K 1/181–187; H05K 1/11; H05K 1/117; H05K 2201/09227; H05K 2201/10522; H05K 2201/10734; H05K 2201/10159; G11C 5/02–05; G11C 5/063
(Continued)

(56) References Cited

U.S. PATENT DOCUMENTS 5,880,531 A   3/1999  Hagiya et al.
6,844,616 B2  1/2005  Liao et al.
(Continued)

FOREIGN PATENT DOCUMENTS

JP   2001-024146   1/2001
JP       3799120   7/2006
KR   2008-0071713  8/2008

*Primary Examiner* — Tuan T Dinh
(74) *Attorney, Agent, or Firm* — Fish & Richardson P.C.

(57) ABSTRACT

A semiconductor chip module includes a PCB including first and second faces; a buffer on the first face; a first chip on the first face, and including a first connection terminal and a second connection terminal, a first signal being provided to the first connection terminal, and a second signal being provided to the second connection terminal; a second chip on the second face, and including a third connection terminal to which the first signal is provided, and a fourth connection terminal to which the second signal is provided. The first connection terminal and the third connection terminal receive the first signal from the buffer at the same time. The first connection terminal is closer to the buffer as compared with the second connection terminal. The third connection terminal is closer to the buffer as compared with the fourth connection terminal.

20 Claims, 16 Drawing Sheets

(52) U.S. Cl.
CPC .............. *H05K 2201/09227* (2013.01); *H05K 2201/09509* (2013.01); *H05K 2201/10159* (2013.01); *H05K 2201/10522* (2013.01); *H05K 2201/10545* (2013.01); *H05K 2201/10734* (2013.01)

(58) Field of Classification Search
USPC ................................. 361/764, 784, 788, 803
See application file for complete search history.

(56) References Cited

U.S. PATENT DOCUMENTS

| | | | |
|---|---|---|---|
| 7,102,221 B2 | 9/2006 | Miyamoto et al. | |
| 7,102,905 B2 | 9/2006 | Funaba et al. | |
| 7,242,635 B2 | 7/2007 | Okuda | |
| 7,269,025 B2 * | 9/2007 | David | H01L 23/50 |
| | | | 257/E23.079 |
| 7,440,289 B2 | 10/2008 | Sugano et al. | |
| 8,422,263 B2 | 4/2013 | Saito et al. | |
| 8,510,629 B2 * | 8/2013 | Tsukada | G06F 11/1044 |
| | | | 714/763 |
| 9,406,369 B2 | 8/2016 | Seok et al. | |
| 9,780,049 B2 | 10/2017 | Ahn et al. | |
| 2008/0116572 A1 | 5/2008 | Baek et al. | |
| 2009/0279243 A1 | 11/2009 | Amidi et al. | |
| 2012/0250264 A1 * | 10/2012 | Osanai | G11C 5/04 |
| | | | 361/728 |
| 2013/0135916 A1 * | 5/2013 | Osanai | G11C 5/04 |
| | | | 365/51 |
| 2013/0223001 A1 | 8/2013 | Ryu et al. | |
| 2020/0143867 A1 | 5/2020 | Lee et al. | |

\* cited by examiner

|   | 1 | 2 | 3 | 4 | 5 | 6 | 7 |
|---|---|---|---|---|---|---|---|
| A | VDDQ | DQS_c | TDQS_c | VPP | DM_n,DBI, TDQS_t | DQ1 | VDDQ |
| B | DQ0 | DQS_t | VSS | VSSQ | VSS | VDD | VSS |
| C | DQ4 | DQ2 | VDD | ZQ | VSSQ | DQ3 | DQ5 |
| D | VDDQ | DQ6 | VDDQ | MF=0 | VDDQ | DQ7 | VDDQ |
| E | C2,ODT1 | ODT | VSSQ | VSS | VSSQ | CK_t | CK_c |
| F | C0,CKE1 | CKE | VSS | VDD | VSS | /CS1 | C1 |
| G | WE_n,A14 | ACT_n | VDD | VSS | VDD | CAS_n,A15 | CAS_n,A16 |
| H | BA0 | A10 | VREFCA | VDD | VSS | A12 | BG1 |
| I | BA0 | A4 | RESET_n | VSS | ALERT_n, VMON | A3 | BA1 |
| J | A6 | A0 | A11 | VDD | A13 | A1 | A5 |
| K | A8 | A2 | PARITY | VPP | A17 | A9 | A7 |

240

|   | 1 | 2 | 3 | 4 | 5 | 6 | 7 |
|---|---|---|---|---|---|---|---|
| A | VDDQ | DQS_c | TDQS_c | VPP | DM_n,DBI, TDQS_t | DQ1 | VDDQ |
| B | DQ0 | DQS_t | VSS | VSSQ | VSS | VDD | VSS |
| C | DQ4 | DQ2 | VDD | ZQ | VSSQ | DQ3 | DQ5 |
| D | VDDQ | DQ6 | VDDQ | MF=0 | VDDQ | DQ7 | VDDQ |
| E | C2,ODT1 | ODT | VSSQ | VSS | VSSQ | CK_t | CK_c |
| F | C0,CKE1 | CKE | VSS | VDD | VSS | /CS1 | C1 |
| G | WE_n,A14 | ACT_n | VDD | VSS | VDD | CAS_n,A15 | CAS_n,A16 |
| H | BA0 | A10 | VREFCA | VDD | VSS | A12 | BG1 |
| I | BA0 | A4 | RESET_n | VSS | ALERT_n, VMON | A3 | BA1 |
| J | A6 | A0 | A11 | VDD | A13 | A1 | A5 |
| K | A8 | A2 | PARITY | VPP | A17 | A9 | A7 |

|   | 1 | 2 | 3 | 4 | 5 | 6 | 7 |
|---|---|---|---|---|---|---|---|
| A | VDDQ | DQS_c | TDQS_c | VPP | DM_n,DBI, TDQS_t | DQ1 | VDDQ |
| B | DQ0 | DQS_t | VSS | VSSQ | VSS | VDD | VSS |
| C | DQ4 | DQ2 | VDD | ZQ | VSSQ | DQ3 | DQ5 |
| D | VDDQ | DQ6 | VDDQ | REU | VDDQ | DQ7 | VDDQ |
| E | C2,ODT1 | ODT | VSSQ | VSS | VSSQ | CK_t | CK_c |
| F | C0,CKE1 | CKE | VSS | VDD | VSS | /CS1 | C1 |
| G | WE_n,A14 | ACT_n | VDD | VSS | VDD | CAS_n,A15 | CAS_n,A16 |
| H | BA0 | A10 | VREFCA | VDD | VSS | A12 | BG1 |
| I | BA0 | A4 | RESET_n | VSS | ALERT_n, VMON | A3 | BA1 |
| J | A6 | A0 | A11 | VDD | A13 | A1 | A5 |
| K | A8 | A2 | PARITY | VPP | A17 | A9 | A7 |

240

|   | 1 | 2 | 3 | 4 | 5 | 6 | 7 |
|---|---|---|---|---|---|---|---|
| A | VDDQ | DQS_c | TDQS_c | VPP | DM_n,DBI, TDQS_t | DQ1 | VDDQ |
| B | DQ0 | DQS_t | VSS | VSSQ | VSS | VDD | VSS |
| C | DQ4 | DQ2 | VDD | ZQ | VSSQ | DQ3 | DQ5 |
| D | VDDQ | DQ6 | VDDQ | REU | VDDQ | DQ7 | VDDQ |
| E | C2,ODT1 | ODT | VSSQ | VSS | VSSQ | CK_t | CK_c |
| F | C0,CKE1 | CKE | VSS | VDD | VSS | /CS1 | C1 |
| G | WE_n,A14 | ACT_n | VDD | VSS | VDD | CAS_n,A15 | CAS_n,A16 |
| H | BA0 | A10 | VREFCA | VDD | VSS | A12 | BG1 |
| I | BA0 | A4 | RESET_n | VSS | ALERT_n, VMON | A3 | BA1 |
| J | A6 | A0 | A11 | VDD | A13 | A1 | A5 |
| K | A8 | A2 | PARITY | VPP | A17 | A9 | A7 |

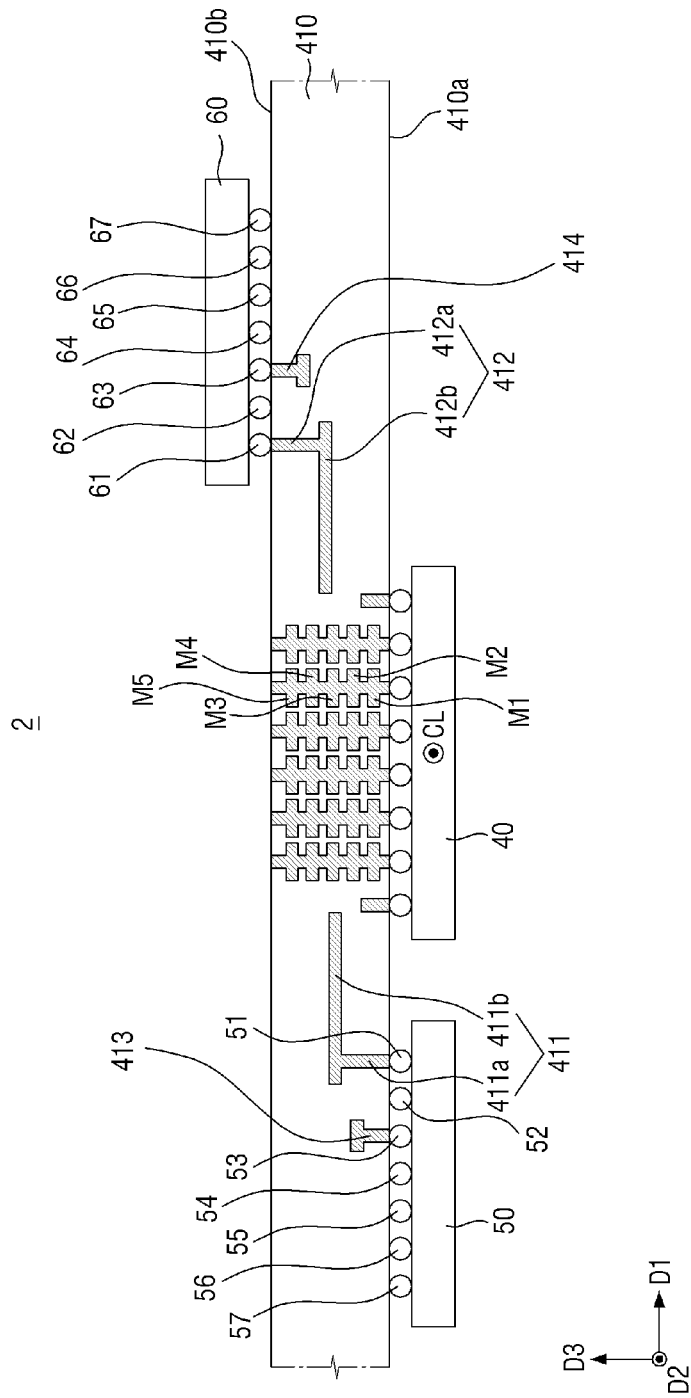

SEMICONDUCTOR CHIP MODULE

CROSS-REFERENCE TO RELATED APPLICATIONS

This application is a continuation of U.S. application Ser. No. 17/210,907, filed on Mar. 24, 2021, which claims priority to Korean Patent Application No. 10-2020-0098372, filed on Aug. 6, 2020, in the Korean Intellectual Property Office and entitled "Semiconductor Chip Module," each of which is incorporated by reference herein in its entirety.

BACKGROUND

1. Field

Embodiments relate to a semiconductor chip module.

2. Description of the Related Art

In a memory module, a buffer may receive a signal provided by an external host, and may re-drive with left/right channels.

SUMMARY

Embodiments are directed to a semiconductor chip module, including: a printed circuit board (PCB) including first and second faces facing each other; a buffer on the first face of the PCB; a first chip on the first face of the PCB, and including a first connection terminal and a second connection terminal, a first signal being provided to the first connection terminal, and a second signal different from the first signal being provided to the second connection terminal; a second chip on the second face of the PCB, and including a third connection terminal to which the first signal is provided, and a fourth connection terminal to which the second signal is provided. The first connection terminal of the first chip and the third connection terminal of the second chip may receive the first signal from the buffer at the same time. The first connection terminal may be located closer to the buffer as compared with the second connection terminal. The third connection terminal may be located closer to the buffer as compared with the fourth connection terminal.

Embodiments are also directed to a semiconductor chip module including a printed circuit board (PCB) including a first face and a second face facing each other, the semiconductor chip module including: a first chip on the first face of the PCB, and including a first connection terminal to receive a first signal; a second chip on the second placed of the PCB, and including a second connection terminal to receive the first signal; and a buffer, including a first fin electrically connected to the first connection terminal, and including a second fin electrically connected to the second connection terminal. The PCB may include a first wiring structure that provides the first signal from the first connection terminal to the first fin, and a second wiring structure that connects the second connection terminal and the second fin. The first wiring structure and the second wiring structure may be located symmetrically on the basis of a center line of the buffer from the viewpoint of viewing the PCB in a plane. A mirror function operation may not be performed on the first chip and the second chip with respect to each other.

Embodiments are also directed to a semiconductor chip module, including: a printed circuit board (PCB) including a first face and a second face facing each other; a buffer on the first face of the PCB; a plurality of first memory chips on the first face of the PCB, each first memory chip including a first connection terminal to which a first signal is provided, and performing a first operation in response to the first signal and a first chip selector signal; a plurality of second memory chips on the second face of the PCB, each second memory chip including a second connection terminal to which the first signal is provided, and performing the first operation in response to the first signal and the first chip selector signal; a plurality of third memory chips on the first face of the PCB, each of the third memory chips including a third connection terminal to which a second signal is provided, and performing a second operation in response to the second signal and a second chip selector signal; and a plurality of fourth memory chips on the second face of the PCB, each of the fourth memory chips including a fourth connection terminal to which the second signal is provided, and performing the second operation in response to the second signal and the second chip selector signal. The first connection terminals of the plurality of first memory chips and the second connection terminals of the plurality of second memory chips may receive the first signal from the buffer at the same time. The third connection terminals of the plurality of third memory chips and the fourth connection terminals of the plurality of fourth memory chips may receive the second signal from the buffer at the same time.

DESCRIPTION

Brief Description of the Drawings

Features will become apparent to those of skill in the art by describing in detail example embodiments with reference to the attached drawings in which:

FIG. 7 is a diagram explaining an example of signals assigned to a connection terminal (a solder ball) of the semiconductor chip of FIG. 6;

FIG. 8 is a diagram explaining an example of signals assigned to the connection terminal (the solder ball) of the semiconductor chip of FIG. 6;

FIG. 16 is a diagram for explaining a part of an electronic system according to some other example embodiments.

DETAILED DESCRIPTION

Figure 1:
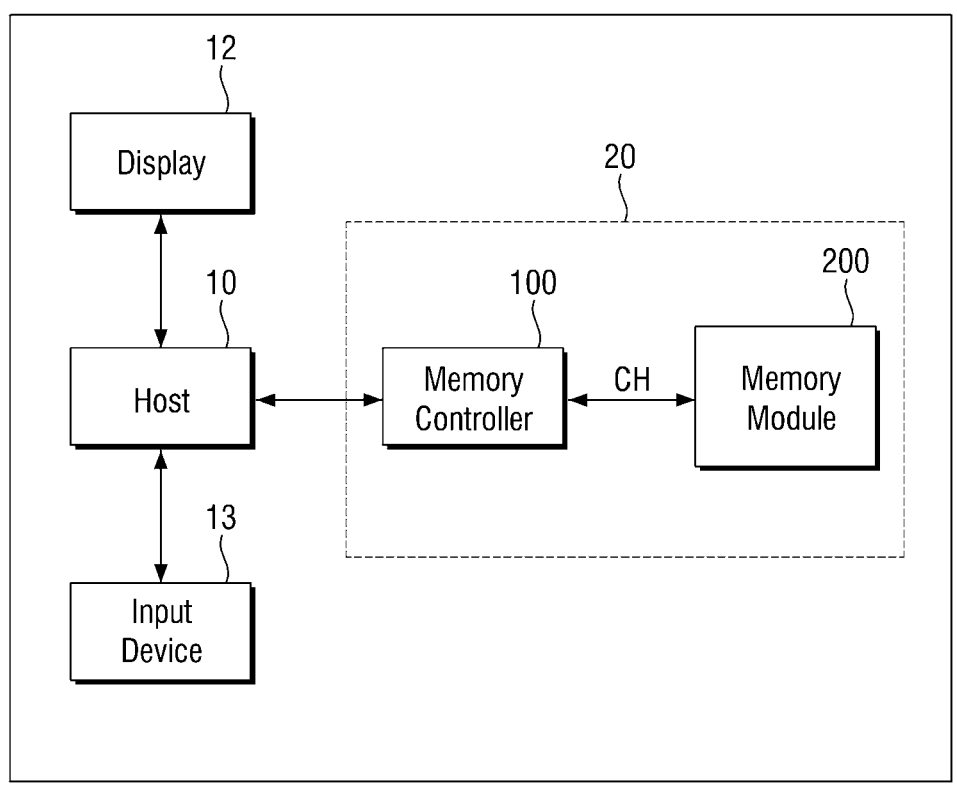
FIG. 1 is a block diagram showing an electronic system according to some example embodiments.
Figure 2:
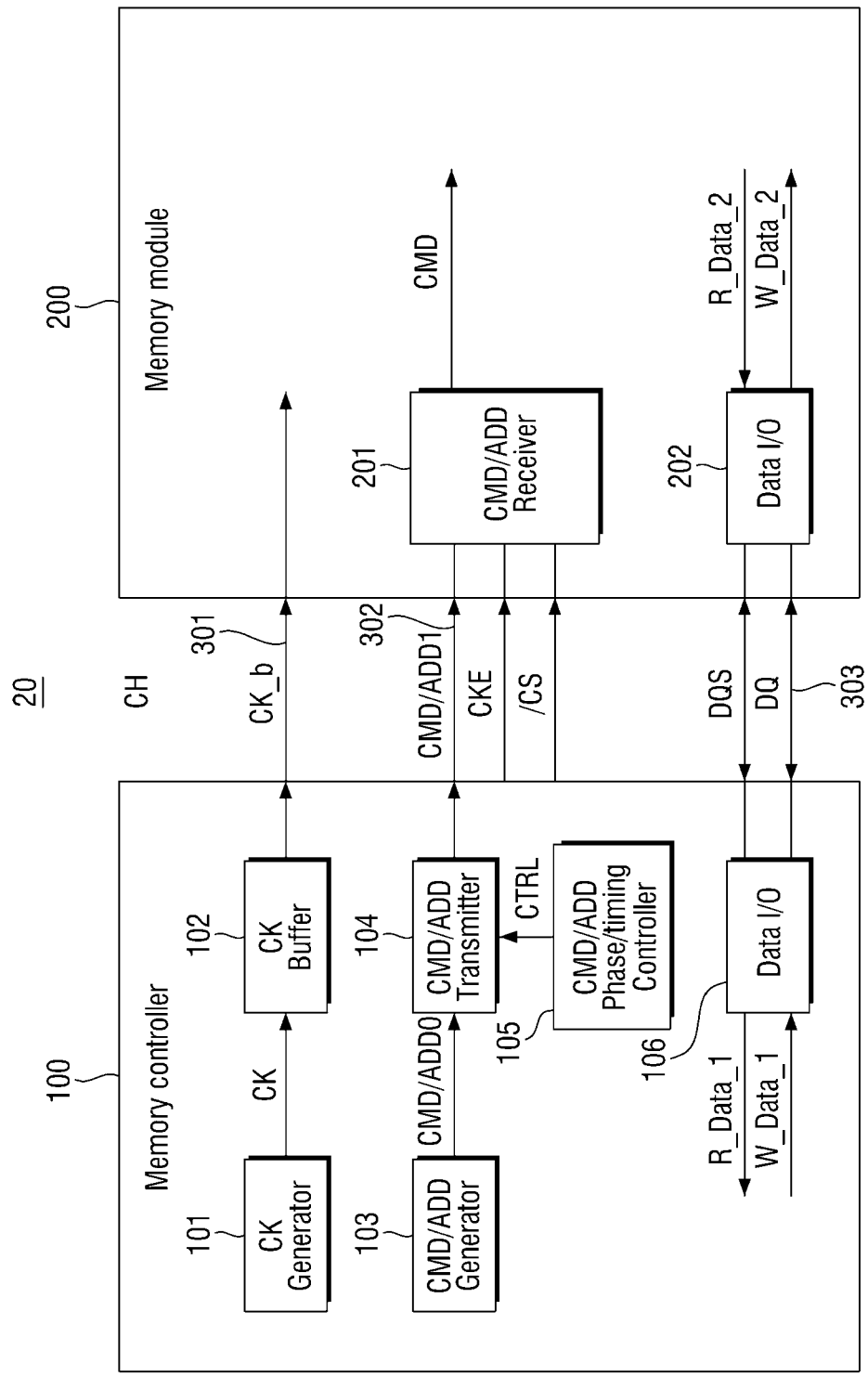
FIG. 2 is a block diagram for showing a memory system according to some example embodiments.

FIG. 1 is a block diagram showing an electronic system 1 according to some example embodiments. FIG. 2 is a block diagram for showing a memory system 20 according to some example embodiments.

Referring to FIGS. 1 and 2, the electronic system 1 including the memory system 20 shown in FIG. 2 may be implemented as, e.g., a personal computer or a network server.

The electronic system 1 may include a host 10, a memory system 20, a memory controller 100 to control the data processing operation of a memory module 200, a display 12, and an input device 13.

The host 10 may display the data stored in the memory system 20 through the display 12 according to the data which is input through the input device 13.

The input device 13 may be implemented as a pointing device such as a touchpad or a computer mouse, a keypad, or a keyboard. The host 10 may control the overall operation of the electronic system 1, and may control the operation of the memory controller 100. The memory controller 100 may be the memory controller 100 shown in FIGS. 4, 11, 12, and 14.

The memory controller 100 may be implemented as a part of the host 10, or may be implemented as a chip separate from the host 10.

The memory system 20 may include a memory controller 100 and a memory module 200. The memory controller 100 may include a clock generator 101, a clock buffer 102, a command/address generator 103, a command/address transmitter 104, a phase/timing controller 105, and a data I/O unit 106.

The memory controller 100 may transmit a clock signal CK generated from the clock generator 101 to the clock buffer 102, buffer the received clock signal CK, and provide the buffered clock signal CK_b to the memory module 200 through a clock signal line 301.

The command/address generator 103 may generate an initial command/address signal CMD/ADD0 and provide it to the command/address transmitter 104. The command/address transmitter 104 may receive the initial command/address signal CMD/ADD0 and adjust the phase or timing of the initial command/address signal CMD/ADD0 in response to the control signal CTRL of the phase/timing controller 208 to generate a first command/address signal CA1, and the first command/address signal CA1 may be provided to the memory module 200 through the command/address bus 302.

Thereafter, although not shown, the first command/address signal CMD/ADD1 may be provided to a register and a comparator, the value thereof may be stored in the register, and the stored value may be used when performing a calibration.

The first command/address signal CMD/ADD1 may be provided to the memory device 30 together with a buffered clock signal CK_b.

The data I/O unit 106 may receive read data R_Data1 that is to be transmitted from the memory module 200 through a DQ bus 303 when generally operating, and/or may transmit a write data W_Data1 that is to be written in the memory module 200 to the memory module 200 through a DQ bus 303.

Although not shown, the data I/O unit 106 may receive a second command/address signal CMD/ADD2, which corresponds to the value of the first command/address signal CMD/ADD1 received by the memory module 200, from the memory module 200 through the DQ bus 303, when calibrating the command/address signal CMD/ADD.

The memory module 200 may include a command/address receiver 201 and a data I/O unit 202.

The command/address receiver 201 may generate a second command/address signal CMD/ADD2 according to a chip selector signal /CS, a clock enable signal CKE, and a first command/address signal CMD/ADD1 transmitted through the command/address bus 302 in response to the buffered clock signal CK_b. The command/address receiver 201 may be configured separately from the command/address signal bus 302, and may be provided in the memory module 200 by being included in the command/address signal bus 302, like a first chip selector signal /CS1 and a second chip selector signal /CS2 shown in FIGS. 5, 11, 12, and 14.

The clock enable signal CKE may be used as a pseudo command that acts as a read command of the first command/address signal CMD/ADD1 transmitted through the command/address bus 302. The command/address receiver 304 may generate the second command/address signal CMD/ADD2 according to the first command/address signal CMD/ADD1 received when the clock enable signal CKE is enabled.

Although not shown, the second command/address signal CMD/ADD2 may be provided to the data I/O unit 202 to perform calibration.

The data I/O unit 202 may generally receive the read data R_Data2 transmitted from an internal circuit block of the memory module 200 in the read operation, and transmit it to the DQ bus 303 or transmit the second command/address signal CMD/ADD2 to the DQ bus 303 when performing calibration.

The data I/O unit 202 may read the write data W_Data1 to be written in the memory module 200 through the DQ bus 303 in a general writing operation, and transmit it to the internal circuit block of the memory device 30.

Although not shown, the second command/address signal CMD/ADD2 that is output from the memory module 200 may be provided to the memory controller 100 through the DQ bus 303. The data I/O unit 106 of the memory controller 100 and the data I/O unit 202 of the memory module 200 may be connected to each other through the DQS bus and the DQ bus 303.

Figure 3:
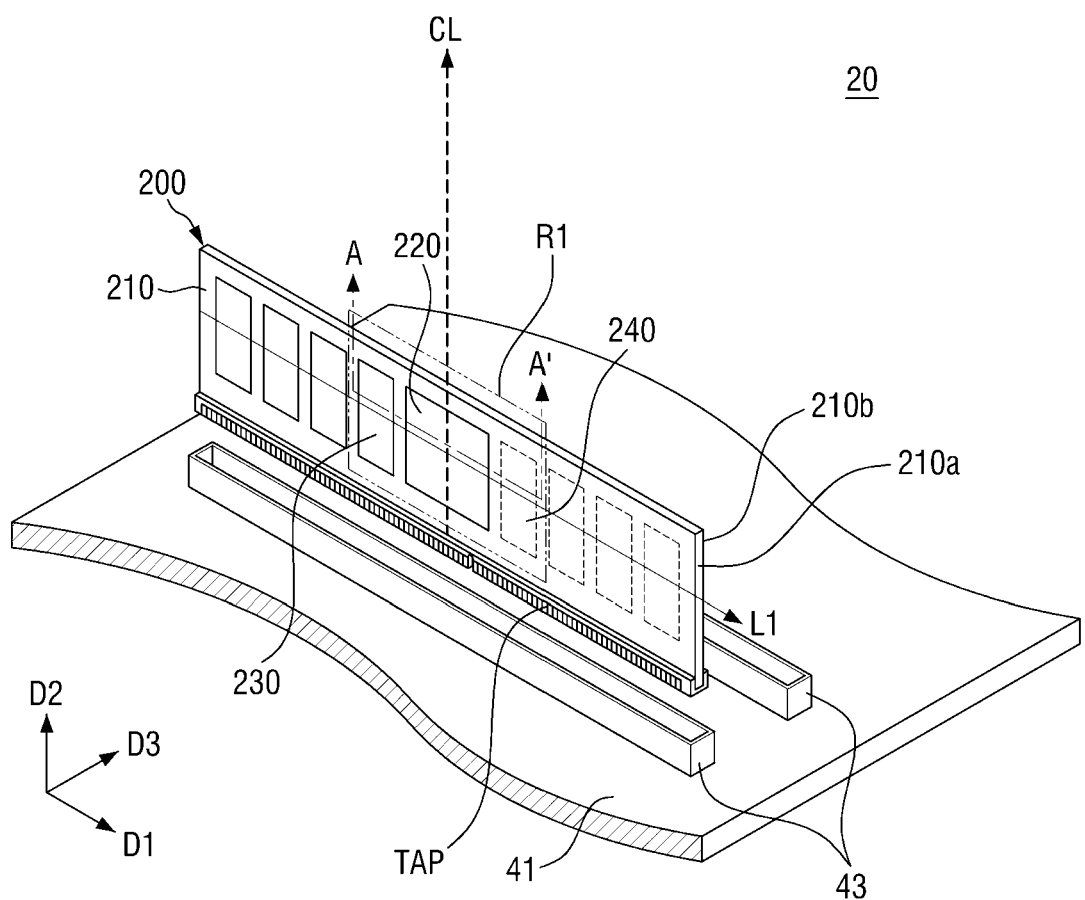
FIG. 3 is a perspective view showing a part of a memory system according to some example embodiments.
Figure 4:
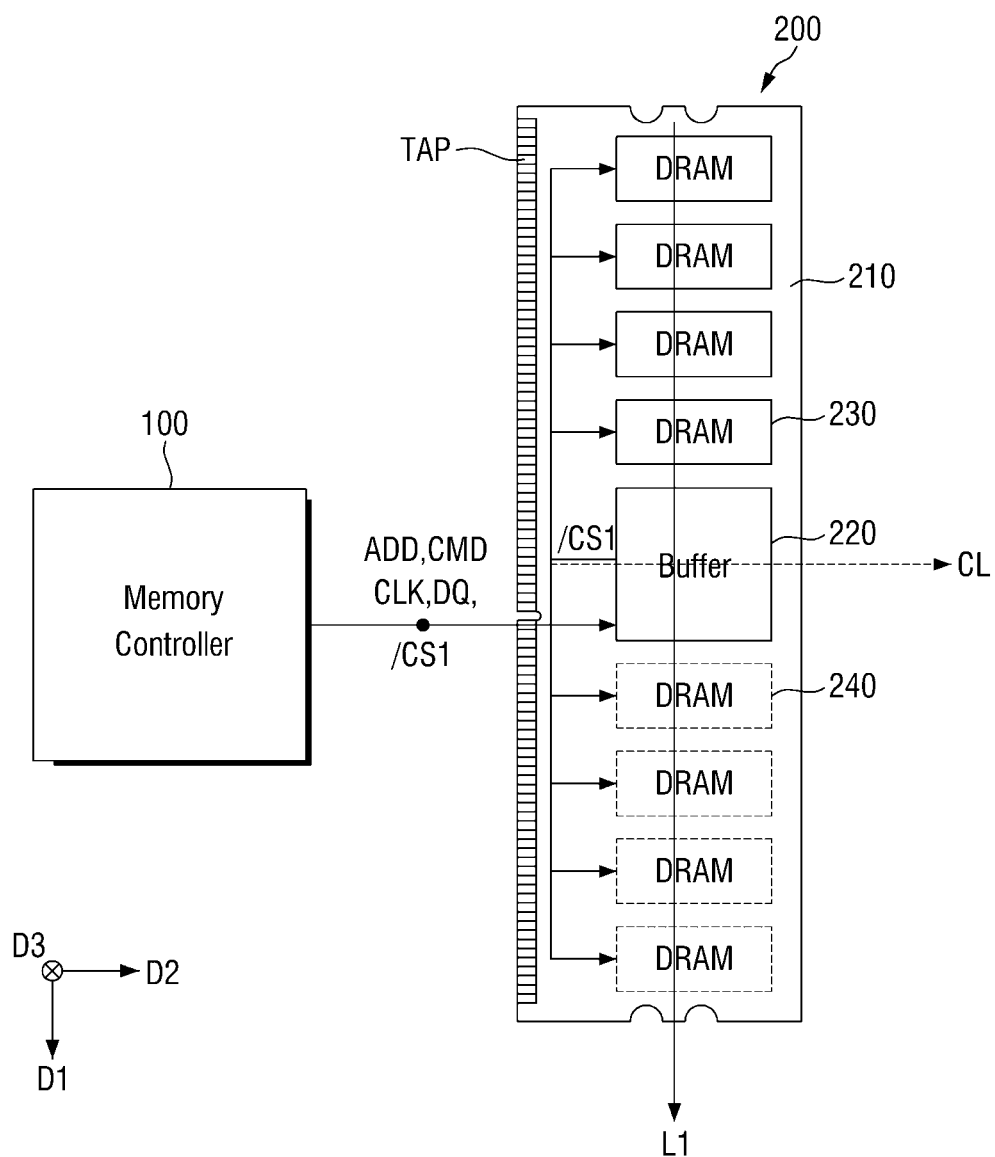
FIG. 4 is a diagram for explaining one side of the memory module shown in FIG. 3.

FIG. 3 is a perspective view showing a part of a memory system according to some example embodiments. FIG. 4 is a diagram for explaining one side of the memory module shown in FIG. 3.

Referring to FIGS. 3 and 4, the memory system 20_1 may include a mother board 41, a memory module 200, and a connector 43.

One of the memory devices applied to the memory system 20_1 according to some example embodiments is a DRAM (Dynamic Random Access Memory). Examples of DRAM include an SDRAM (Synchronous Dynamic Random Access Memory), a DDR DRAM (Double Data Rate Dynamic Random Access Memory), and the like. Specifications of the DRAM may include a DDR-3 SDRAM, a DDR-4 SDRAM, and a DDR-5 SDRAM. The DRAM may be a synchronous DRAM such as an RDRAM (Rambus DRAM) or the like.

Also, one of the memory devices applied to the memory system 20_1 according to some example embodiments may be selected from various memories such as an SRAM (Static Random Access Memory) and a non-volatile memory.

The memory, such as a DRAM, may be mounted in a computer system in the form of a memory module in which a large number of memory chips form one rank, to realize a high performance and a large capacity. The memory module 200 according to some example embodiments has a DIMM (Dual In Memory Module) structure. Explanation related to the rank will be described below.

The connector 43 may be attached to the mother board 41, and the connector 43 may electrically connect the memory module 200 and the mother board 41. The memory module 200 may be inserted into the connector 43 and electrically connected to the mother board 41. Respective connectors 43 may be referred to as slots.

The memory module 200 may include a printed circuit board (PCB) 210, a re-driving buffer 220, and a plurality of first and second semiconductor memory chips 230 and 240.

The PCB 210 may include a first face 210a and a second face 210b facing each other. The PCB 210 may include first to fourth wiring structures 211 to 214 (see FIG. 9) placed between the first face 210a and the second face 210b. Explanation of the wiring structure will be provided below.

The plurality of first and second semiconductor memory chips 230 and 240 may be volatile memory devices or non-volatile memory devices. The volatile memory devices may be a RAM (random access memory), a DRAM (dynamic RAM), an SRAM (static RAM), a T-RAM (thyristor RAM), a Z-RAM (zero capacitor RAM), or a TTRAM (Twin Transistor RAM). The non-volatile memory devices may be an EEPROM (Electrically Erasable Programmable Read-Only Memory), a flash memory, a MRAM (Magnetic RAM), a Spin-Transfer Torque MRAM, a FeRAM (Ferroelectric RAM), a PRAM (Phase change RAM), or a resistor memory (Resistive RAM (RRAM)). In some example embodiments, the plurality of first and second semiconductor memory chips 230 and 240 may be DRAM.

Each of the plurality of first and second semiconductor memory chips 230 and 240 may be a semiconductor memory package. The semiconductor memory packages may be a PoP (Package On Package), a BGAs (Ball Grid Arrays), a CSPs (Chip Scale Packages), a PLCC (Plastic Leaded Chip Carrier), a PDIP (Plastic Dual In-Line Package), a COB (Chip On Board), a CERDIP (CEramic Dual In-Line Package), a MQFP (plastic metric quad flat pack), a TQFP (Thin Quad Flat Pack), an SOIC (Small-Outline Integrated Circuit), an SSOP (Shrink Small Outline Package), a TSOP (Thin Small Outline Package), an SIP (System In Package), a MCP (Multi Chip Package), a WLP (Wafer-Level Package), or a WSP (Wafer-level processed Stack Package).

The plurality of first semiconductor memory chips 230 may be placed on the first face 210a of the PCB 210. The plurality of second semiconductor memory chips 240 may be placed on the second face 210b of the second PCB 210. The plurality of first and plurality of second semiconductor memory chips 230 and 240 may be placed along a first line L1 extending in the first direction D1 from the viewpoint of viewing the PCB 210 in a plane.

The plurality of first semiconductor memory chips 230 and the plurality of second semiconductor memory chips 240 may all be enabled by the first chip selector signal /CS1 and perform the same memory operation with one rank. For example, referring to FIG. 4, eight DRAM chips may form one rank, and may be placed on both sides of the substrate along the first line L1. The DRAM chips may input and output 8-bit data signals DQ0, DQ1, DQ6, DQ7 (see FIGS. 7 and 8). Thus, one rank may have a data I/O bus width (DQ Bus Width) of ×64.

The plurality of first semiconductor memory chips 230 and the plurality of second semiconductor memory chips 240 may enter an enable state in response to the first chip selector signal /CS1 applied from the memory controller 100, and may receive input of the command signal, the address signal, the power signal, and the like at the same time. In response to this, the plurality of first semiconductor memory chips 230 and the plurality of second semiconductor memory chips 240 may perform operations at the same time. Thus, the eight DRAM chips may share the first chip selector signal /CS1. Thus, the chip selector signal /CS1 of the memory module 200 may be provided to all eight of the DRAM chips.

According to some example embodiments, the plurality of first semiconductor memory chips 230 and the plurality of second semiconductor memory chips 240 do not perform the mirror function operation with respect to each other, except that they operate with the same rank. This will be described below in connection with FIGS. 5 to 8.

A re-driving buffer 220 may be located on, e.g., the first face 210a of the PCB 210.

The re-driving buffer 220 may transmit the signals transmitted from the tab TAP to each of the plurality of first and second semiconductor memory chips 230 and 240. The signals may include at least one of a data signal DQ, an address signal ADD, a command signal CMD, and a first chip selector signal /CS1 that are output from the memory controller 100.

Although not shown, according to embodiment, the re-driving buffer 220 may include a register and a PLL circuit. The PLL circuit may be replaced with a DLL (delay locked loop) circuit. In some example embodiments, the re-driving buffer 220 may store the address signal ADD and/or command signal CMD (which are output from the memory controller 100) in the register, and may supply a clock signal CK (which is output from the PLL circuit (not shown)) to each of the plurality of first and second semiconductor memory chips 230 and 240.

The tabs TAP connected to the connectors 43 may be formed at one edge of the PCB 210.

The memory module 200 may receive the address signal ADD and the command signal CMD from the memory controller 100 through the tabs TAP. The memory module 200 may send or receive the data signal DQ and the data strobe signal DQS to or from the memory controller 100 through the tabs TAP. The tabs TAP may be implemented as, e.g., copper (Cu), tungsten (W), tungsten nitride (WN), titanium (Ti), titanium nitride (TiN), tantalum (Ta), tantalum nitride (TaN), gold (Au), and/or a combination thereof. In some example embodiments, the tabs TAP may include gold (Au) coated on the surface of copper (Cu).

The tabs TAP may be electrically connected in series or in parallel with the plurality of first and second semiconductor memory chips 230 and 240 and the re-driving buffer 220. The tabs TAP may be electrically connected to a plurality of first and second semiconductor memory chips 230 and 240 attached to the memory module 200. The tabs TAP may be pins.

Figure 5:
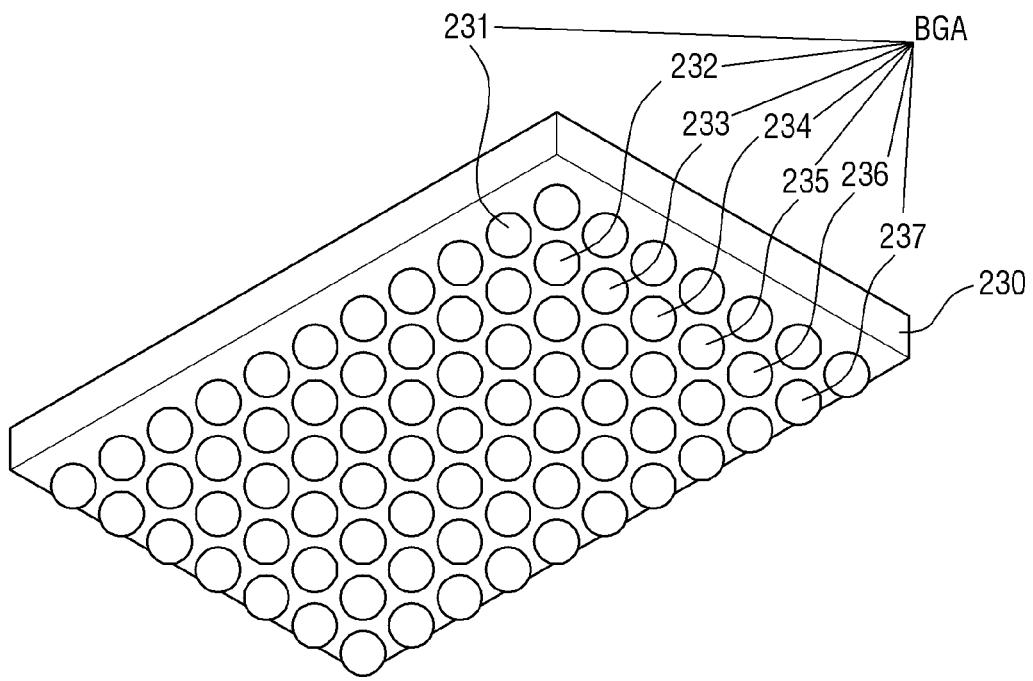
FIG. 5 is a perspective view for explaining a semiconductor chip according to some example embodiments.
Figure 6:
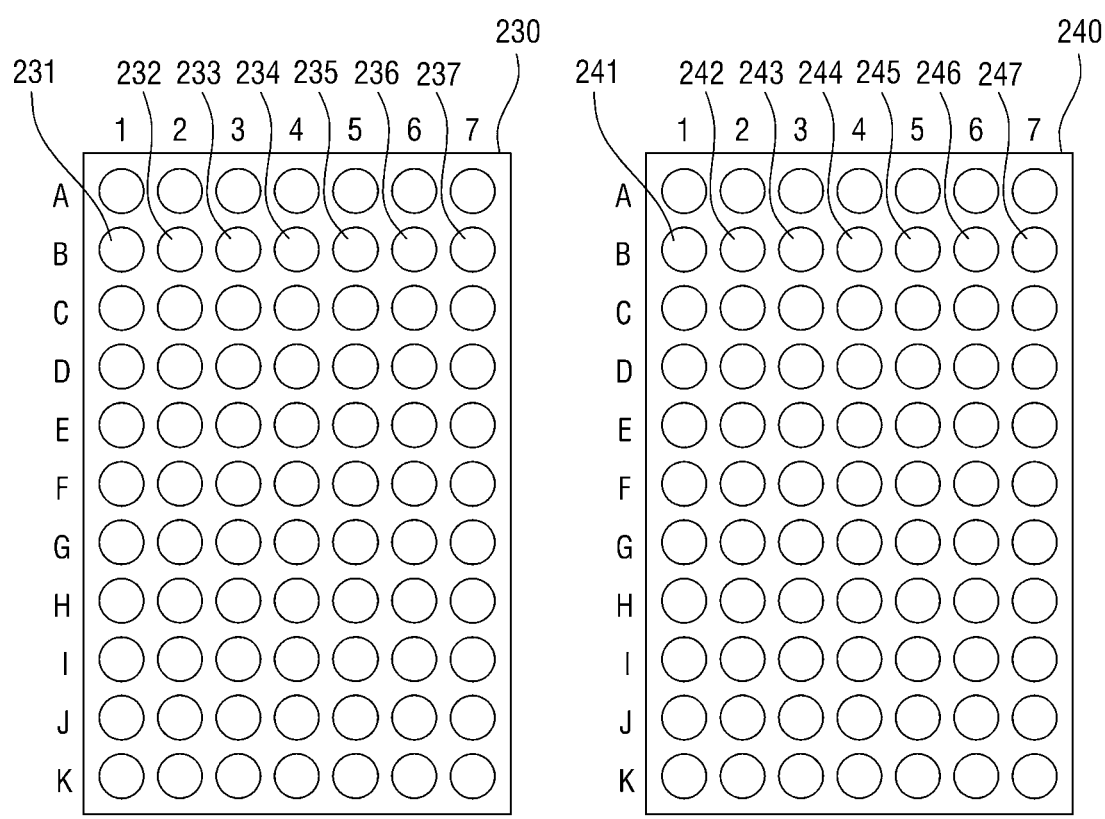
FIG. 6 is a plan view briefly showing a lower face of the semiconductor chip according to some example embodiments.

FIG. 5 is a perspective view for explaining a semiconductor chip according to some example embodiments. FIG. 6 is a plan view briefly showing the lower face of the semiconductor chip according to some example embodiments.

Referring to FIG. 5, the plurality of first semiconductor memory chips 230 may include first to seventh connection terminals 231 to 237 included in a ball grid array BGA on the lower face.

The first to seventh connection terminals 231 to 237 may be implemented as a plurality of solder balls. The plurality of solder balls may connect the plurality of first semiconductor memory chips 230 and the PCB 210. The solder balls may be made of a conductive material.

Referring to FIG. 6, the ball grid array BGA may include the plurality of solder balls placed in a row direction at equal intervals and placed in a column direction at equal intervals. As an example, the ball grid array BGA may include the plurality of solder balls arranged in eleven rows and seven columns on the lower face of a plurality of first semiconductor memory chips 230. The eleven rows of the ball grid array BGA may be defined as a row A to a row K, respectively. The seven columns of the ball grid array 420 may be defined as a first column to a seventh column, respectively.

The plurality of second semiconductor memory chips 240 may include a structure corresponding to the plurality of first semiconductor memory chips 230, and thus may include first to seventh connection terminals 241 to 247 corresponding to the first to seventh connection terminals 231 to 237 of the plurality of first semiconductor memory chips 230, and may include the same ball grid array (BGA) structure.

The arrangement of the number of rows and columns of the solder balls may be varied relative to that illustrated.

FIG. 7 is a diagram explaining an example of signals assigned to the connection terminal (solder ball) of the semiconductor chip of FIG. 6. The position of the signal assignments may be varied relative to that illustrated.

Referring to FIG. 7, the signals used for the operation of the plurality of first semiconductor memory chips 230 may be assigned to each solder ball of the ball grid array BGA.

The first to fourth solder balls of the row A may be assigned to an I/O power supply voltage VDDQ, a DQS_c signal, a TDQS_c signal, and a high voltage VPP. When the plurality of first semiconductor memory chips 230 is used for ×4 I/O, the TDQS_c signal may not be used. The solder balls of the fifth column in the row A may be assigned to the DM_n signal, the DBI signal and the TDQS_t signal. When the plurality of first semiconductor memory chips 230 is used for ×4 I/O, the TDQS_t signal may not be used. The solder balls of the sixth and seventh columns in the row A may be assigned to the first data signal DQ1 and the I/O power supply voltage VDDQ.

The solder balls of the first to seventh columns in the row B may be assigned to a 0th data signal DQ0, a DQS_t signal, a ground voltage VSS, an I/O ground voltage VSSQ, a ground voltage VSS, a power supply voltage VDD, and a ground voltage VSS, respectively. The solder balls of the first to seventh columns in the row B may correspond to the first to seventh connection terminals 231 to 237.

The solder balls of the first to seventh columns in the row C may be assigned to a fourth data signal DQ4, a second data signal DQ2, a power supply voltage VDD, a ZQ signal, an I/O ground voltage VSSQ, a third data signal DQ3, and a fifth data signal DQ5, respectively. When the plurality of first semiconductor memory chips 230 is used for ×4 I/O, the fourth and fifth data signals DQ4 and DQ5 may not be used.

The solder balls of the first to seventh columns in the row D may be assigned to an I/O power supply voltage VDDQ, a sixth data signal DQ6, the I/O power supply voltage VDDQ, a mirror function (MF), the I/O power supply voltage VDDQ, a seventh data signal DQ7, and the I/O power supply voltage VDDQ, respectively. When the plurality of first semiconductor memory chips 230 is used for ×4 I/O, the sixth and seventh data signals DQ6 and DQ7 may not be used. In an example embodiment, the signal applied to the mirror function (MF) signal is 0, and the signal assigned to the solder ball of the ball grid array BGA is not symmetrically inverted.

The solder balls of the first column in the row E may be assigned to the C2 signal and ODT1 signal. The solder balls of the second to seventh columns in the row E may be assigned to an ODT signal, an I/O ground voltage VSSQ, a ground voltage VSS, an I/O ground voltage VSSQ, a CK_t signal, and a CK_c signal, respectively.

The solder balls of the first column in the row F may be assigned to the C0 signal and the CKE1 signal. The solder balls of the second to sixth columns in the row F may be assigned to the CKE signal, the ground voltage VSS, the power supply voltage VDD, the ground voltage VSS, and the first selector signal /CS1 signal, respectively. The solder balls of the seventh column in the row F may be assigned to the C1 signal.

The solder balls of the first column in the row G may be assigned to a WE_n signal and a fourteenth address signal A14. The solder balls of the second to fifth columns in the row G may be assigned to the ACT_n signal, the power supply voltage VDD, the ground voltage VSS, and the power supply voltage VDD. The solder balls of the sixth column in the row G may be assigned to a CAS_n signal and a fifteenth address signal A15. The solder balls of the seventh column in the row G may be assigned to a RAS_n signal and a sixteenth address signal A16.

The solder balls of the first to seventh columns in the row H may be assigned to a 0th block group address signal BG0, a tenth address signal A10, a VREFCA signal, a power supply voltage VDD, a ground voltage VSS, a twelfth address signal A12s and a first block group address signal BG1.

The solder balls of the first to fourth columns in the row I may be assigned to a 0th block address signal BA0, a fourth address signal A4, a RESET_n signal, and a ground voltage VSS, respectively. The solder balls of the fifth column in the row I may be assigned to an ALERT_n signal and may be used for voltage monitoring. The solder balls of the sixth and seventh columns in the row I may be assigned to a third address signal A3 and a first block address signal BA1, respectively.

The solder balls of the first to seventh columns in the row J may be assigned to a sixth address signal A6, a 0th address signal A0, an eleventh address signal A11, a power supply voltage VDD, a thirteenth address signal A13, a first address signal A1, and a fifth address signal A5, respectively.

The solder balls of the first to seventh columns in the row K may be assigned to an eighth address signal A8, a second address signal A2, a PARITY signal, a high voltage VPP, an eleventh address signal A17, a ninth address signal A9, and a seventh address signal A7, respectively. When the plurality of first semiconductor memory chips 230 is used for ×8 I/O, the eleventh address signal A17 may not be used.

The signals used for the operation of the plurality of second semiconductor memory chips 240 may be assigned to the ball grid array BGA on the lower face of the plurality of second semiconductor memory chips 240, and the assignment positions may be the same as those of the plurality of first semiconductor memory chips 230.

In the fourth column in the row D, the signal applied to the mirror function MF is 0, and the assignment position is not symmetrically inverted. Therefore, even when the lower faces of the plurality of first semiconductor memory chips 230 face the lower faces of the plurality of second semiconductor memory chips 240, the ball grid arrays placed on the lower face of the respective chips are not stacked and do not completely overlap each other.

However, when the signal applied to the mirror function (MF) signal applied to the plurality of second semiconductor memory chips 240 is 1, an operation controller (not shown) included in the plurality of second semiconductor memory chips 240 may operate to perform the mirror function operation on the plurality of first semiconductor memory chips 230.

For example, when the signal applied to the mirror function (MF) signal is 1, the signal assigned to the sixth column in the row A of the plurality of second semiconductor memory chips 240 is not the first data signal DQ1 but a DQS_t signal, which is the signal assigned to second column in the row A assigned symmetrically. Therefore, when the lower faces of the plurality of first semiconductor memory chips 230 face the lower faces of the plurality of second semiconductor memory chips 240, the ball grid arrays placed on the lower faces of the respective chips are stacked and may completely overlap each other.

The mirror function (MF) signal applied to the plurality of first semiconductor memory chips 230 and the plurality of second semiconductor memory chips 240 of the present disclosure may be 0, and the plurality of first semiconductor memory chips 230 and the plurality of second semiconductor memory chips 240 may not perform the mirror function operations on each other.

FIG. 8 is a diagram explaining an example of a signal assigned to the connection terminal (solder ball) of the semiconductor chip of FIG. 6. The position of the signal assignment may be varied relative to that illustrated.

The signal assignment of the ball grid array placed on lower faces of a plurality of first and second semiconductor memory chips 230' and 240' of FIG. 8 may correspond to the assignment in the plurality of first and second semiconductor memory chips 230 and 240 of FIG. 7. Hereinafter, the signal assignment of the ball grid array placed on the lower face of the semiconductor memory chip according to some other embodiments will be explained referring to FIG. 8. Differences from the signal assignment of the ball grid array shown in FIG. 7 will be mainly explained.

In the present example embodiment, the mirror function (MF) signal is not assigned to the ball grid arrays of the plurality of first and second semiconductor memory chips 230' and 240' of FIG. 8. Thus, the plurality of first and second semiconductor memory chips 230' and 240' does not include an operation controller for performing the mirror function operation. Therefore, regardless of the signals applied to the plurality of first and second semiconductor memory chips 230' and 240', even when the lower faces of the plurality of first semiconductor memory chips 230' face the lower faces of the plurality of second semiconductor memory chips 240', the ball grid arrays BGA placed on the lower faces of each chip are not stacked and do not completely overlap each other.

Figure 9:
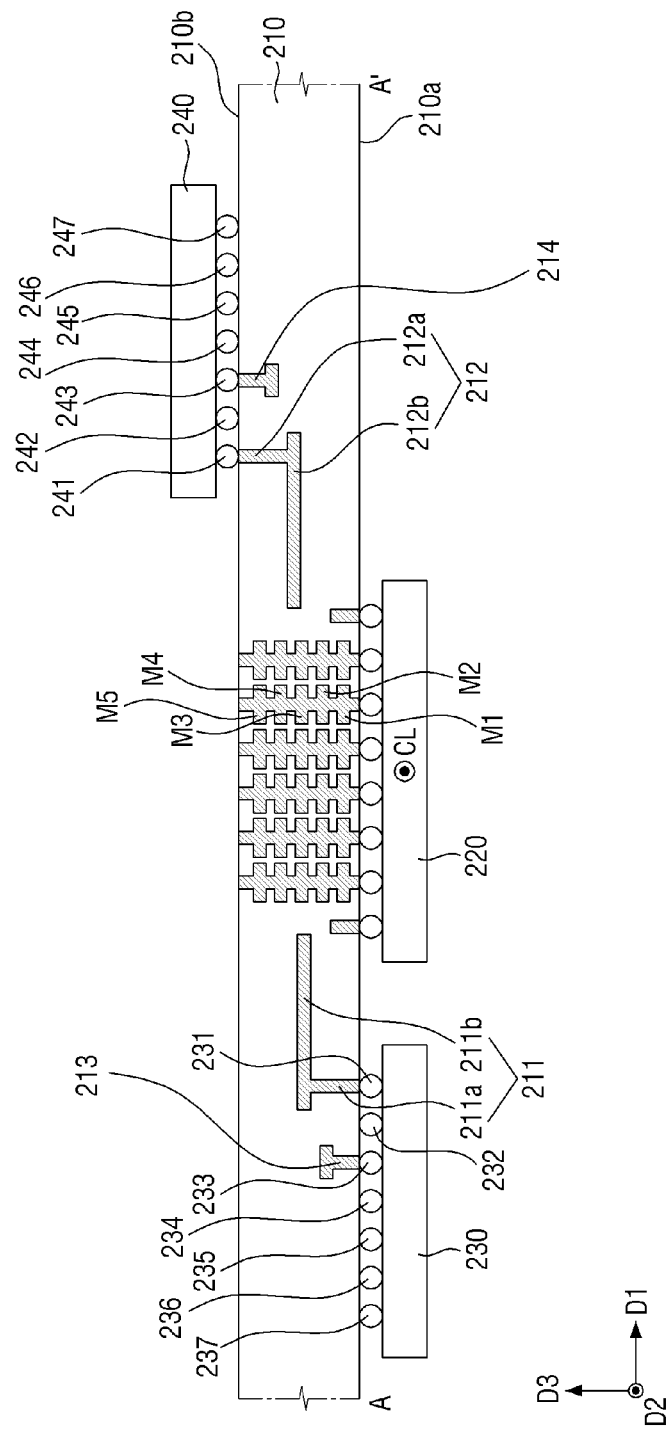
FIG. 9 is a cross-sectional view taken along a line A-A' of FIG. 3.
Figure 10:
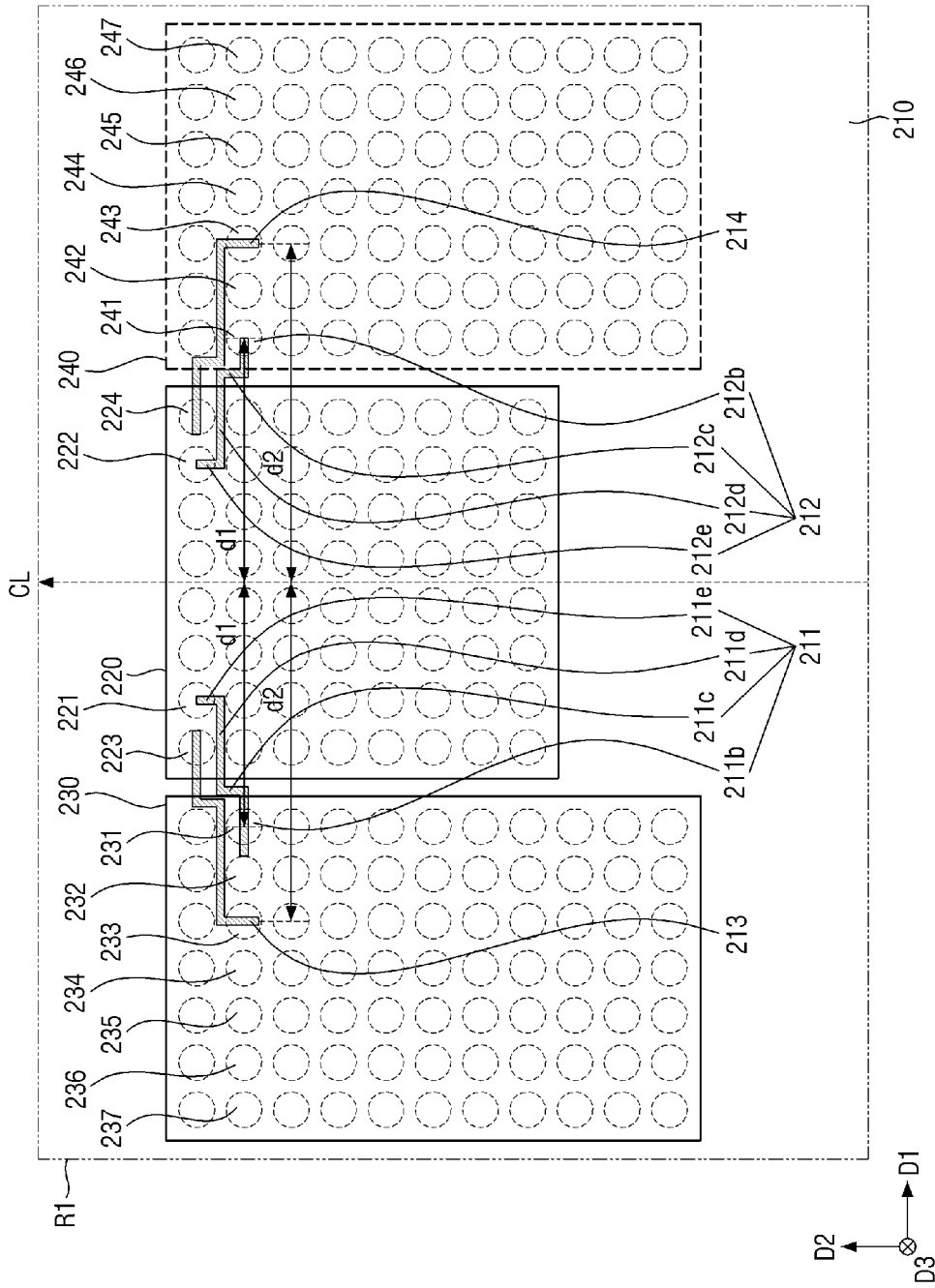
FIG. 10 is a diagram for explaining a wiring structure included in a PCB in a region R of FIG. 3.

FIG. 9 is a cross-sectional view taken along a line A-A' of FIG. 3. FIG. 10 is a diagram for explaining a wiring structure included in the PCB in the region R of FIG. 3.

Referring to FIGS. 9 and 10, a PCB 210 may include a first wiring structure 211, a second wiring structure 212, a third wiring structure 213, and a fourth wiring structure 214.

The first wiring structure 211, the second wiring structure 212, the third wiring structure 213, and the fourth wiring structure 214 may include at least some of the first layer conductive film to the fifth layer conductive film M1 to M5 in the PCB 210. However, the number of conductive film layers shown in the drawings is merely an example, and the number of layers of the conductive film may be varied.

The first wiring structure 211 may electrically connect the first connection terminal 231 of the plurality of first semiconductor memory chips 230 and the first pin 221 of the re-driving buffer 220, and may provide the first data signal (DQ0, see FIG. 7) corresponding to the operating signal provided by the first pin 221 of the re-driving buffer 220 to the first connection terminal 231.

The first wiring structure 211 may include a first via 211a, a first conductive pattern 211b, a second conductive pattern 211c, a third conductive pattern 211d, and a fourth conductive pattern 211e.

The second wiring structure 212 may electrically connect the first connection terminal 241 of the plurality of second semiconductor memory chips 240 and the second pin 222 of the re-driving buffer 220, and may provide the first data signal (DQ0, see FIG. 7) provided by the second pin 222 of the re-driving buffer 220 and corresponding to the operating signal to the first connection terminal 241.

The second wiring structure 212 may include a first via 212a, a first conductive pattern 212b, a second conductive pattern 212c, a third conductive pattern 212d, and a fourth conductive pattern 212e.

The first connection terminal 231 of the plurality of first semiconductor memory chips 230 and the first connection terminal 241 of the plurality of second semiconductor memory chips 240 may receive the same first data signal (DQ0, see FIG. 7) from the re-driving buffer 220.

In the present example embodiment, the first wiring structure 211 and the second wiring structure 212 are symmetrical on the basis of a center line CL of the re-driving buffer 220 when viewed from the first plane D1-D2. The first connection terminal 231 of the plurality of first semiconductor memory chips 230 and the first connection terminal 241 of the plurality of second semiconductor memory chips 240 are also placed symmetrically on the basis of the center line CL of the re-driving buffer 220. Therefore, when viewed from the first plane D1-D2, a distance d1 between the first connection terminal 231 of the plurality of first semiconductor memory chips 230 and the center line CL of the re-driving buffer 220 is the same as a distance d1 between the first connection terminal 241 of the plurality of second semiconductor memory chips 240 and the center line CL of the re-driving buffer 220.

The third wiring structure 213 may electrically connect the third connection terminal 233 of the plurality of first semiconductor memory chips 230 and the third pin 223 of the re-driving buffer 220, and may provide the ground voltage (VSS, see FIG. 7) provided by the third pin 223 of the re-driving buffer 220 and corresponding to the power signal to the third connection terminal 233.

The fourth wiring structure 214 may electrically connect the third connection terminal 243 of the plurality of second semiconductor memory chips 240 and the fourth pin 224 of the re-driving buffer 220, and may provide the ground voltage (VSS, see FIG. 7) provided by the fourth pin 224 of the re-driving buffer 220 and corresponding to the power signal to the third connection terminal 243.

The third connection terminal 233 of the plurality of first semiconductor memory chips 230 and the third connection terminal 243 of the plurality of second semiconductor memory chips 240 may receive the same ground voltage (VSS, see FIG. 7) from the re-driving buffer 220.

In the present example embodiment, the third wiring structure 213 and the fourth wiring structure 214 are symmetrical on the basis of the center line CL of the re-driving buffer 220 when viewed from the first plane D1-D2. The third connection terminal 233 of the plurality of first semiconductor memory chips 230 and the third connection terminal 243 of the plurality of second semiconductor memory chips 240 are also placed symmetrically on the basis of the center line CL of the re-driving buffer 220. Therefore, when viewed from the first plane D1-D2, the distance d2 between the third connection terminal 233 of the plurality of first semiconductor memory chips 230 and the center line CL of the re-driving buffer 220 is the same as a distance d2 between the third connection terminal 243 of the plurality of second semiconductor memory chips 240 and the center line CL of the re-driving buffer 220. In addition, a distance d1 between the first connection terminal 231 of the plurality of first semiconductor memory chips 230 and the center line CL of the re-driving buffer 220 is shorter than a distance d2 between the third connection terminal 233 of the plurality of first semiconductor memory chips 230 and the center line CL of the re-driving buffer 220.

In the re-driving buffer 220 according to some example embodiments, the first pin 221 and the second pin 222 may be placed symmetrically on the basis of the center line CL, and the third pin 223 and the fourth pin 224 may also be placed symmetrically on the basis of the center line CL. Further, the pin arrangement placed on the lower face of the re-driving buffer 220 may be placed symmetrically on the basis of the center line CL of the re-driving buffer 220.

The wiring structure shown in FIGS. 9 and 10 is merely an example, and some parts may be omitted.

The semiconductor chip modules according to some example embodiments may improve the efficiency of the semiconductor chip module by making the routing symmetrical in the semiconductor chip module in which the mirror function is not performed.

Figure 11:
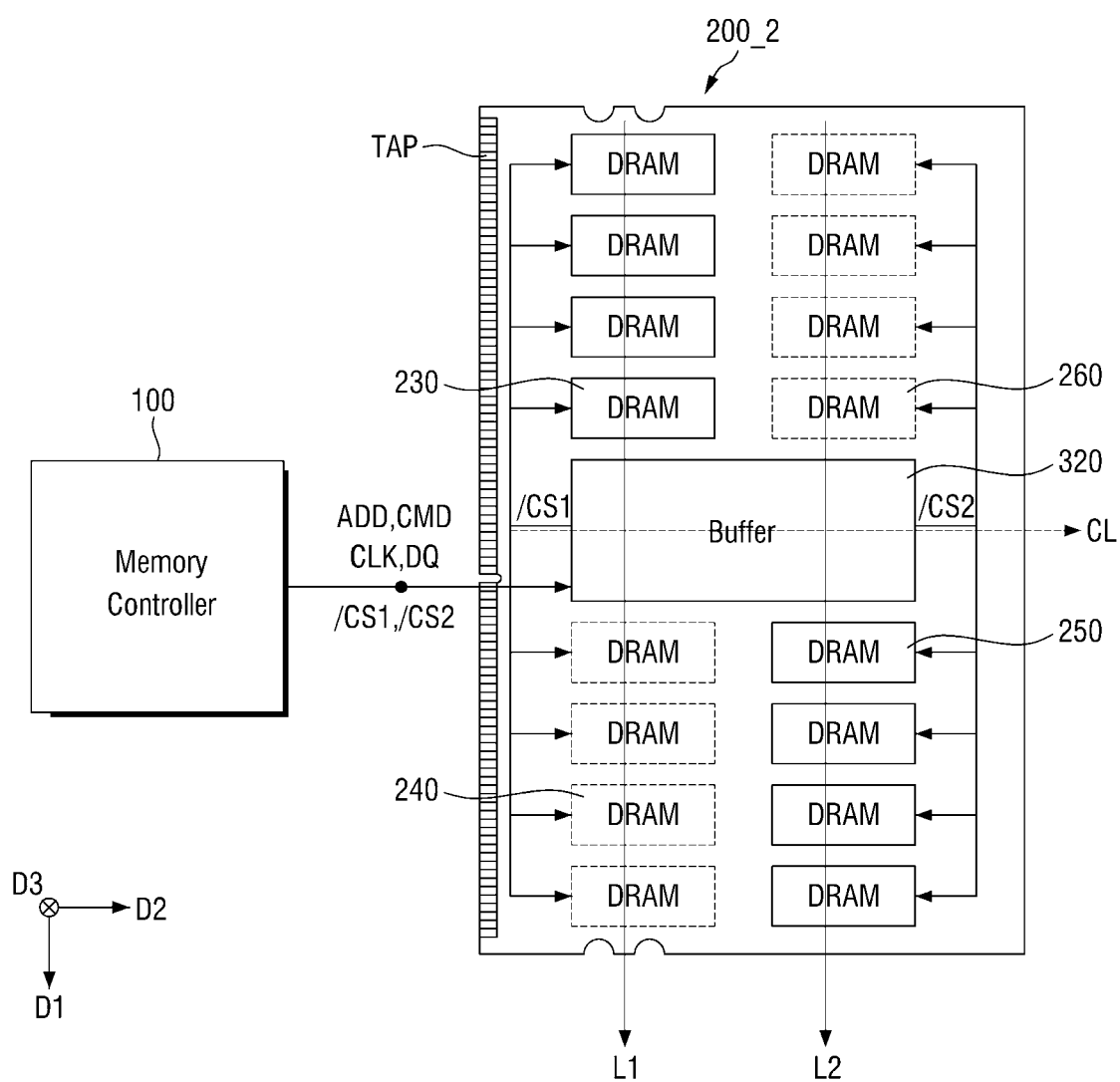
FIG. 11 is a diagram for explaining a memory module of some other example embodiments.

FIG. 11 is a diagram for explaining a memory module 200_2 according to some other example embodiments. Differences from the memory module 200 of FIG. 4 will be mainly explained.

The memory module 200_2 further includes a plurality of third semiconductor memory chips 250 and a plurality of fourth semiconductor memory chips 260 when compared with the memory module 200 of FIG. 4. The plurality of third semiconductor memory chips 250 and the plurality of fourth semiconductor memory chips 260 may be arranged to extend in the first direction D1 and may be placed along a second line L2 spaced apart from the first line L1 in the second direction D2.

In the present example embodiment, the plurality of third semiconductor memory chips 250 corresponds to the plurality of first semiconductor memory chips 230, and the plurality of fourth semiconductor memory chips 260 corresponds to the plurality of second semiconductor memory chips 240. However, the plurality of third semiconductor memory chips 250 and the plurality of fourth semiconductor memory chips 260 simultaneously perform the memory operations with one rank by the second chip selector signal /CS2.

According to the present example embodiment, the second chip selector signal /CS2 is supplied from the memory controller 100, and then may be provided to the plurality of third semiconductor memory chips 250 and the plurality of fourth semiconductor memory chips 260 through the re-driving buffer 220.

In the case of the embodiment of FIG. 11 above, the routing may be made symmetrical, while operating in two or more ranks in one memory module in which the mirror function is not performed.

Figure 12:
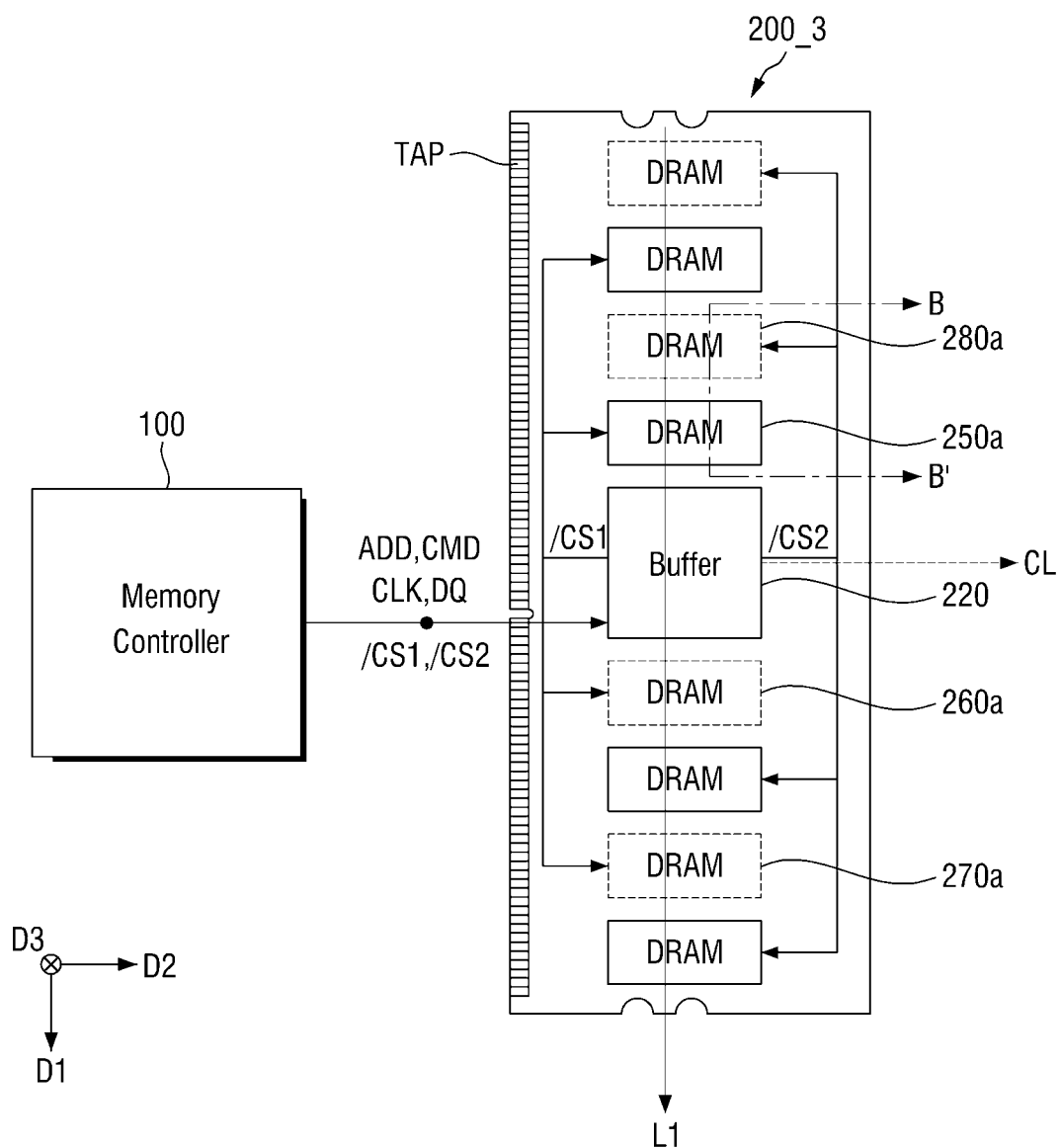
FIG. 12 is a diagram for explaining a memory module of some other example embodiments.
Figure 13:
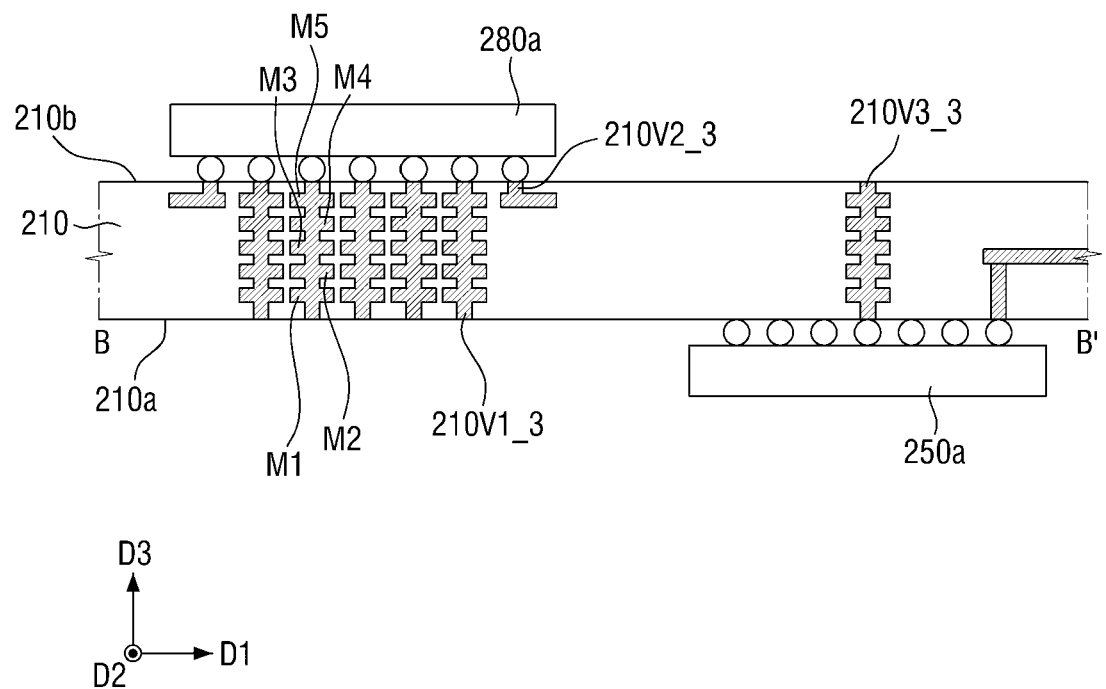
FIG. 13 is a cross-sectional view taken along a line B-B' of FIG. 12.

FIG. 12 is a diagram for explaining a memory module 200_3 according to some other example embodiments. FIG. 13 is a cross-sectional view taken along a line B-B' of FIG. 12. Differences from the memory module 200_2 in FIG. 11 will be mainly explained.

In the present example embodiment, first to fourth semiconductor memory chips 250a to 280a may be placed along the first line L1. The first to fourth semiconductor memory chips 250a to 280a do not overlap each other from the viewpoint of the first plane D1-D2. Therefore, the connection terminals of the plurality of first semiconductor memory chips 250a do not overlap the plurality of fourth semiconductor memory chips 280a from the viewpoint of viewing the PCB 210 in a plane, and the connection terminals of the plurality of second semiconductor memory chips 260 do not overlap the plurality of third semiconductor memory chips 270a from the viewpoint of viewing the PCB 210 in a plane.

The PCB 210 according to some example embodiments may include a first penetration via 210V1_3 and a second penetration via 210V2_3 penetrating the first face 210a and the second face 210b of the PCB 210, and a blind via 210V2_3. The first penetration via 210V1_3 and the blind via 210V2_3 may be electrically connected to a plurality of fourth semiconductor memory chips 280a. The second penetration via 210V2_3 may be electrically connected to the plurality of first semiconductor memory chips 250a.

In a situation in which the mirror function operation is not performed on the first to fourth semiconductor memory chips 250a to 280a, because the first to fourth semiconductor memory chips 250a to 280a do not overlap each other from the viewpoint of the first plane D1-D2, the PCB 210 may include the penetration via.

Figure 14:
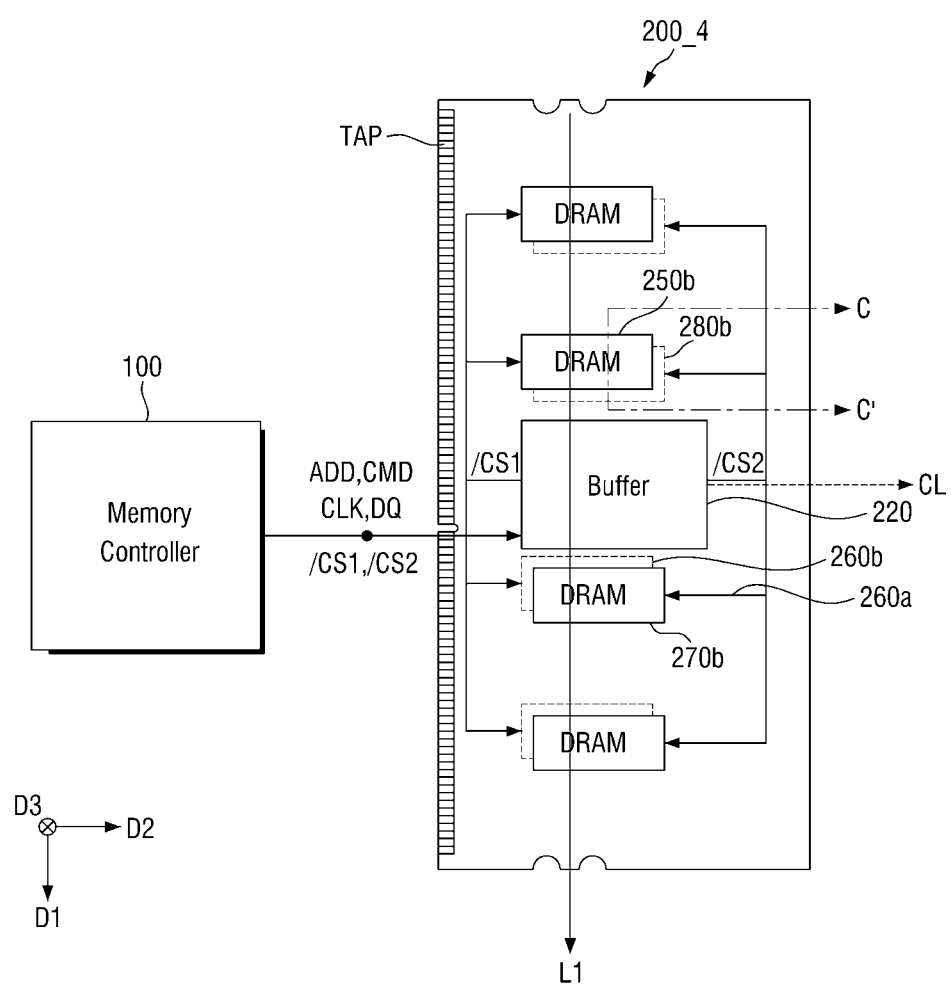
FIG. 14 is a diagram for explaining a memory module of some other example embodiments.
Figure 15:
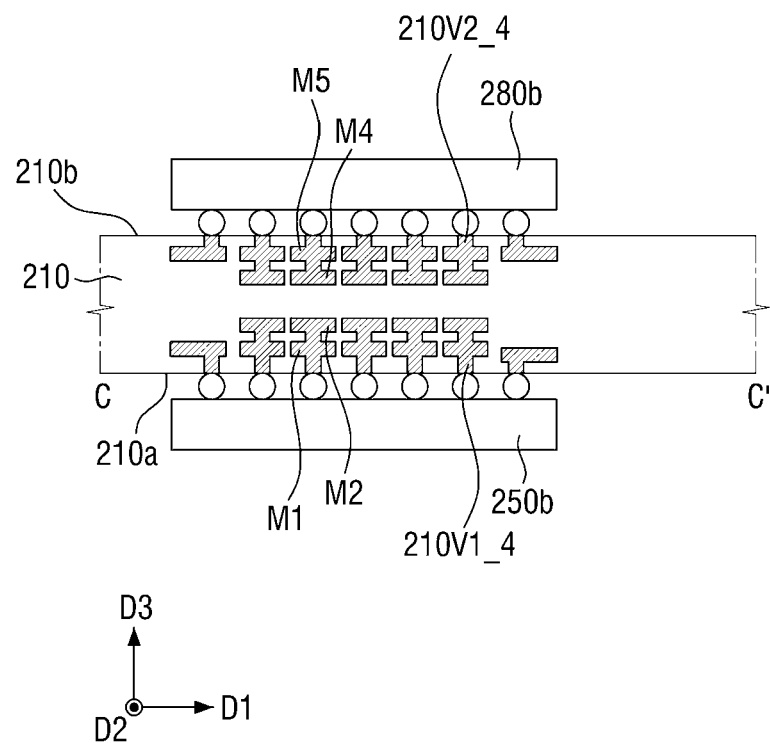
FIG. 15 is a cross-sectional view taken along a line C-C' of FIG. 14.

FIG. 14 is a diagram for explaining a memory module 200_4 according to some other example embodiments. FIG. 15 is a cross-sectional view taken along a line C-C' of FIG. 14. Differences from the memory modules 200_3 of FIGS. 12 and 13 will be mainly explained.

In the present example embodiment, the first to fourth semiconductor memory chips 250b to 280b overlap each other from the viewpoint of the first plane D1-D2. Therefore, the connection terminals of the plurality of first semiconductor memory chips 250b overlap the plurality of fourth semiconductor memory chips 280b from the viewpoint of viewing the PCB 210 in a plane, whereas the connection terminals of the plurality of second semiconductor memory chips 260b do not overlap the plurality of third semiconductor memory chips 270b from the viewpoint of viewing the PCB 210 in a plane.

The PCB 210 according to some example embodiments may include a first blind via 210V1_4 and a second blind via 210V2_4. The first blind via 210V1_4 may be electrically connected to a plurality of first semiconductor memory chips 250a, and the second blind via 210V2_4 may be electrically connected to a plurality of fourth semiconductor memory chips 280a.

In a situation in which the mirror function operation is not performed on the first to fourth semiconductor memory chips 250a to 280a, because the first to fourth semiconductor memory chips 250a to 280a overlap each other from the viewpoint of the first plane D1-D2, the PCB 210 may not include the penetration via and may include only the blind via.

A plurality of first semiconductor memory chips 250a and a plurality of fourth semiconductor memory chips 280a overlapping each other through the blind via may be electrically separated from each other.

FIG. 16 is a diagram for explaining a part of an electronic system according to some other example embodiments. Differences from the electronic systems 1 of FIGS. 1 to 3 will be mainly explained.

When compared with the electronic system 1 of FIGS. 1 to 3, the electronic system 2 may further include a main buffer 40, a first re-driving buffer chip 50, a second re-driving buffer chip 60, and first to fourth mother board wiring structures 411 to 414.

The mother board 41 corresponds to the PCB 210 of FIG. 4, the main buffer 40 corresponds to the re-driving buffer 220 of FIG. 4, the first re-driving buffer chip 50 corresponds to the plurality of first semiconductor memory chips 230 of FIG. 4, the second re-driving buffer chip 60 corresponds to the plurality of second semiconductor memory chips 240 of FIG. 4, and the first to fourth mother board wiring structures 411 to 414 correspond to the first to fourth wiring structures 211 to 214 of FIG. 4.

The first re-driving buffer chip 50 may be placed on the first face 41a of the mother board 41, the second re-driving buffer chip 60 may be placed on the second face 41b of the mother board 41. The first and second re-driving buffer chips 50 and 60 do not perform the mirror function operation with each other.

Accordingly, from the viewpoint of the first plane D1-D2, the first and second re-driving buffer chips 50 and 60 may be placed symmetrically on the basis of the center line CL of the main buffer 40. Accordingly, the first mother board wiring structure 411 and the second mother board wiring structure 412 may be placed symmetrically with each other on the basis of the center line CL of the main buffer 40, and the third mother board wiring structure 413 and the fourth mother board wiring structure 414 may be placed symmetrically on the basis of the center line CL of the main buffer 40.

The first and second re-driving buffer chips 50 and 60 correspond to a buffer chip, that is, a semiconductor chip, rather than a semiconductor memory device.

By way of summation and review, left/right pins of a buffer may be placed in a symmetrical structure around the buffer. In the case of a DRAM, a pin arrangement may be reconstructed symmetrically on the basis of the buffer, using a mirror pin function or a mirror function. However, in the case of a semiconductor chip in which the mirror function is not supported or when the mirror function is disabled, a wiring length between the buffer and the semiconductor chip may be different on left and right sides, and signaling between the left and right sides and a layer arrangement of a lower substrate may change, which may result in inefficiencies due to the asymmetric signaling and layer/wiring arrangement.

As described above, embodiments may provide a semiconductor chip module in which semiconductor chips that do not perform a mirror function operation are placed on upper and lower faces of the module. Embodiments may provide a semiconductor chip module in which the wiring between the semiconductor chip and the buffer is placed symmetrically on the basis of the buffer, in a module including the semiconductor chips that do not perform the mirror function operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

The invention claimed is:

1. A semiconductor chip module, comprising:
a printed circuit board (PCB) including a first surface and a second surface;
a buffer chip disposed on the first surface of the PCB;
a first chip disposed on the first surface of the PCB, and including a first connection terminal configured to receive a first signal from a first pin of the buffer chip and a second connection terminal configured to receive a second signal that is different from the first signal from a second pin of the buffer chip that is different from the first pin; and
a second chip disposed on the second surface of the PCB, and including a third connection terminal configured to receive a third signal from a third pin of the buffer chip and a fourth connection terminal configured to receive a fourth signal that is different from the third signal from a fourth pin of the buffer chip that is different from the third pin,
wherein the first connection terminal of the first chip and the third connection terminal of the second chip are configured to receive the first signal and the third signal, respectively, from the buffer chip at the same time.

2. The semiconductor chip module of claim 1, wherein the first surface faces a direction opposite from the second surface.

3. The semiconductor chip module of claim 1, wherein the buffer chip is located between the first chip and the second chip, and
wherein the first connection terminal of the first chip and the third connection terminal of the second chip are symmetrically located with respect to a center line of the buffer chip.

4. The semiconductor chip module of claim 3, wherein a location of the first connection terminal of the first chip is closer to the buffer chip compared to a location of the second connection terminal of the first chip, and
wherein a location of the third connection terminal of the second chip is closer to a location of the fourth connection terminal of the second chip.

5. The semiconductor chip module of claim 4, wherein the PCB includes a first wiring structure connected to the first connection terminal of the first chip, a second wiring structure connected to the second connection terminal of the first chip, a third wiring structure connected to the third connection terminal of the second chip, and a fourth wiring structure connected to the fourth connection terminal of the second chip, and
wherein the first wiring structure and the third wiring structure are symmetrically located with respect to the center line of the buffer chip, and the second wiring structure and the fourth wiring structure are symmetrically located with respect to the center line of the buffer chip.

6. The semiconductor chip module of claim 5,
wherein the first connection terminal is electrically connected to the first pin through the first wiring structure, the second connection terminal is electrically connected to the second pin through the second wiring structure, the third connection terminal is electrically connected to the third pin through the third wiring structure and the fourth connection terminal is electrically connected to the fourth pin through the fourth wiring structure.

7. The semiconductor chip module of claim 6, wherein the first pin and the third pin are symmetrically located with respect to the center line of the buffer chip, and the second pin and the fourth pin are symmetrically located with respect to the center line of the buffer chip.

8. The semiconductor chip module of claim 1, wherein the first chip and the second chip are enabled according to a chip select signal.

9. The semiconductor chip module of claim 1, wherein a mirroring operation is not performed on the first chip and the second chip.

10. The semiconductor chip module of claim 1, wherein the first signal and the third signal are an operating signal, and the second signal and the fourth signal are a power signal.

11. The semiconductor chip module of claim 1, wherein each of the first chip and the second chip is a memory device.

12. A memory system, comprising:
a memory module; and
a memory controller configured to transmit a first signal and a second signal to the memory module,
wherein the memory module includes:
  a printed circuit board (PCB) including a first surface and a second surface;
  a buffer chip disposed on the first surface of the PCB;
  a first memory chip disposed on the first surface of the PCB, and including a first connection terminal configured to receive the first signal from a first pin of the buffer chip and a second connection terminal configured to receive the second signal that is different from the first signal from a second pin of the buffer chip that is different from the first pin; and
  a second memory chip disposed on the second surface of the PCB, and including a third connection terminal configured to receive a third signal from a third pin of the buffer chip and a fourth connection terminal configured to receive a fourth signal that is different from the third signal from a fourth pin of the buffer chip that is different from the third pin,
wherein the first connection terminal of the first memory chip and the third connection terminal of the second memory chip are configured to receive the first signal and the third signal, respectively, from the buffer chip at the same time.

13. The memory system of claim 12, wherein the first surface faces a direction opposite from the second surface.

14. The memory system of claim 12, wherein the buffer chip is located between the first memory chip and the second memory chip, and
wherein the first connection terminal of the first memory chip and the third connection terminal of the second memory chip are symmetrically located with respect to a center line of the buffer chip.

15. The memory system of claim 14, wherein a location of the first connection terminal of the first memory chip is closer to the buffer chip compared to a location of the second connection terminal of the first memory chip, and
wherein a location of the third connection terminal of the second memory chip is closer to a location of the fourth connection terminal of the second memory chip.

16. The memory system of claim 15, wherein the PCB includes a first wiring structure connected to the first connection terminal of the first memory chip, a second wiring structure connected to the second connection terminal of the first memory chip, a third wiring structure connected to the third connection terminal of the second memory chip, and a fourth wiring structure connected to the fourth connection terminal of the second memory chip, and
wherein the first wiring structure and the third wiring structure are symmetrically located with respect to the center line of the buffer chip, and the second wiring structure and the fourth wiring structure are symmetrically located with respect to the center line of the buffer chip.

17. The memory system of claim 16,
wherein the first connection terminal is electrically connected to the first pin through the first wiring structure, the second connection terminal is electrically connected to the second pin through the second wiring structure, the third connection terminal is electrically connected to the third pin through the third wiring structure and the fourth connection terminal is electrically connected to the fourth pin through the fourth wiring structure.

18. The memory system of claim 17, wherein the first pin and the third pin are symmetrically located with respect to the center line of the buffer chip, and the second pin and the fourth pin are symmetrically located with respect to the center line of the buffer chip.

19. The memory system of claim 12, wherein the memory module is connected to the memory controller via a command/address bus and DQ bus,
the memory controller transmits a chip select signal via the command/address bus, and
the first memory chip and the second memory chip are enabled according to the chip select signal.

20. The memory system of claim 12, wherein the memory controller transmits a control signal to the memory module such that a mirroring operation is not performed on the first memory chip and the second memory chip.

* * * * *